United States Patent [19]
Mukohyama et al.

[11] Patent Number: 4,886,840

[45] Date of Patent: Dec. 12, 1989

[54] DILUENT FOR UV AND EB CURABLE RESINS

[75] Inventors: Hideaki Mukohyama, Yatsushiro; Hiroshi Oka, Kawasaki; Kenji Shibusawa, Urawa, all of Japan

[73] Assignee: Kohjin Co., Ltd., Tokyo, Japan

[21] Appl. No.: 360

[22] Filed: Jan. 5, 1987

[30] Foreign Application Priority Data

Feb. 27, 1986 [JP] Japan .................. 61-40235

[51] Int. Cl.$^4$ ............................ C08F 283/00
[52] U.S. Cl. ..................... 522/96; 522/103; 522/107; 522/167; 526/260
[58] Field of Search .......... 522/167, 96, 103, 107; 526/260

[56] References Cited

U.S. PATENT DOCUMENTS

| | | | |
|---|---|---|---|
| 3,845,056 | 10/1974 | Robson | 522/167 |
| 3,876,594 | 4/1975 | Lim | 522/167 |
| 3,891,441 | 6/1975 | Tsuji | 522/12 |
| 4,143,013 | 3/1979 | Jenkinson et al. | |
| 4,235,686 | 11/1980 | Dart | 522/18 |
| 4,252,888 | 2/1981 | Rohloff | |

FOREIGN PATENT DOCUMENTS

| | | | |
|---|---|---|---|
| 53-147024 | 12/1978 | Japan . | |
| 54-74102 | 6/1979 | Japan . | |
| 130608 | 6/1988 | Japan | 326/260 |
| 2195643 | 4/1988 | United Kingdom | 326/260 |

OTHER PUBLICATIONS

Chemical Abstracts, vol. 100, No. 12, Mar. 19, 1984, 94546r.
Chemical Abstracts, vol. 91, No. 26, Dec. 1979, p. 609.
Journal of Polymer Science, vol. 29, 1958, pp. 411–416, by J. Parrod et al.
N-vinyl-2-porrolidone in radiation curing (1984).

*Primary Examiner*—John C. Bleutge
*Assistant Examiner*—David Buttner
*Attorney, Agent, or Firm*—Armstrong, Nikaido, Marmelstein, Kubovcik & Murray

[57] ABSTRACT

Acryloylmorpholine and/or methacryloylmorpholine useful as a reactive diluent for UV and EB curable resin compositions, which has low skin irritation, a little odor, low volatility, low weight loss and high workability and which provides, without imparing work environment, UV and EB curable compositions having a high curing rate and capable of forming films of high hardness with small deformation.

8 Claims, No Drawings

DILUENT FOR UV AND EB CURABLE RESINS

BACKGROUND OF THE INVENTION

The present invention relates to a reactive diluent for ultraviolet and electron beam curable resins.

In recent years, there has been actively forwarded a development of solventless resin compositions curable by radiation of ultraviolet rays or electron beams in view of environmental protection, labor saving and energy saving. In general, these UV or EB radiation curable resin compositions are composed mainly of a photopolymerizable prepolymer and a photopolymerizable vinyl monomer copolymerizable with the prepolymer. The UV curable resin compositions further contain a photoinitiator as an essential component.

The photopolymerizable prepolymers can further polymerize by radiation of ultraviolet rays or electron beams and form a framework of cured polymers. The prepolymer is also called a photopolymerizable unsaturated polymer or a photopolymerizable oligomer. In accordance with the structure of molecule constituting the framework, there are used, for instance, oligomers having acryloyl or methacryloyl group at the polymer end, such as polyester acrylate, polyurethane acrylate, epoxy acrylate, polyether acrylate, oligoacrylate, alkyd acrylate and polyol acrylate.

The photopolymerizable vinyl monomers serve, in cooperation with the prepolymer, to improve the functions of curable resin compositions or the applicability or suitability to uses of cured products. For instance, they are used for the purpose of decreasing the viscosity of the composition to thereby improve the coatability to substrates, imparting the flexibility to cured products, or improving the adhesion to substrates. Also, the curable composition itself can be made solventless by utilizing the dissolving power and polymerizability of the monomers. Since the photopolymerizable monomers are required to have a good copolymerizability with prepolymers and a high curing rate, polyfunctional or monofunctional acrylic monomers are usually used.

Monofunctional monomers serve as a diluent for highly viscous prepolymers, thereby securing the workability of resin compositions in practical use. Moreover, the monomers themselves polymerize to form a part of the structure of cured products without going out from the system. Therefore, it is possible to formulate the curable resin compositions into solventless compositions, thus the monomers have an important meaning in providing UV or EB radiation curable resin compositions free from solvent pollution. In this sense, the photopolymerizable monomers are also called a reactive diluent.

The reactive diluents are essential to have a large ability of lowering the viscosity of prepolymers from the viewpoint of the object of use. Also, it is desirable that the reactive diluents do not give out a bad smell or do not cause health disturbances such as dermatitis in handling them.

In general, however, acrylic monomers have a strong skin irritation and the improvement has been demanded. It is disclosed in Japanese Unexamined Patent Publication (Tokkyo Kokai) No. 147024/1978 that the skin irritation of acrylic monomers is decreased by increasing the molecular weight of monomers. However, when the molecular weight is increased too large, the ability of lowering the viscosity of prepolymers is decreased, because the viscosity of the monomers themselves rises. Also, in cases, the compatibility with prepolymers is decreased. For such reasons, there has been strongly desired a development of a reactive diluent monomer having a high dissolving power, a high diluting effect, a low volatility, a low smelling property, a low skin irritation, and moreover having an excellent curing activity.

SUMMARY OF THE INVENTION

It has now been found that acryloylmorpholine and its derivative have characteristics as an ideal reactive diluent, that is to say, they have excellent characteristics such as good reducibility, high dissolving power, low volatility, low smelling property and low skin irritation which have been considered to be difficult to achieve them together, and moreover the curing activity is high.

In accordance with the present invention, there is provided a reactive diluent for photopolymerizable prepolymers in ultraviolet or electron beam radiation curable resin compositions, which comprises a compound of the formula (1):

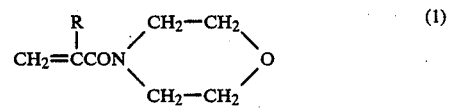

wherein R is hydrogen atom or methyl group.

The reactive diluent of the present invention is used, in a UV or EB curing system where a photopolymerizable prepolymer is reacted with monofunctional and/or polyfunctional photopolymerizable monomers copolymerizable with the prepolymer, for dissolving or diluting the reaction system and for enabling a homogeneous reaction, if necessary, by using a photoinitiator and a sensitizer. Also, the reactive diluent itself reacts to form a part of cured products.

Acryloylmorpholine used in the present invention is a known compound, for instance, as reported in "Polyacrylamides dérivés d'amides cyclyques" [J. Parrod and J. Elles, J. Polymer Sci., Vol 29, 411 (1985)], and is easily available for any persons.

The greatest feature of the reactive diluent of the present invention is that the skin irritation which is the greatest defect of conventional reactive diluents, is very low and, therefore, the safety is very high. That is to say, the primary skin irritation index (PI value), which is an index showing the degree of skin irritation, of the compound of the above formula (1) is not more than 0.50 and is very low in comparison with other acrylate monomers as described after. In addition to a high safety, the reactive diluent of the invention also has excellent characteristics such as high dissolving power and reducibility for prepolymers, low smelling property, low volatility and high curing activity, and it is not too much to say that the reactive diluent of the invention is an ideal reactive diluent. These characteristics and the advantages of the reactive diluent of the invention will apparent from Examples and Comparative Examples described after.

In another aspect, the present invention also provides a resin composition curable by radiation of ultraviolent rays or electron beams which comprises a photopolymerizable prepolymer and a compound of the formula:

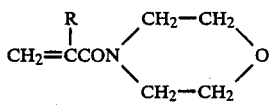

wherein R is hydrogen atom or methyl group. The composition may further contain other known photopolymerizable monomers, a photoinitiator, a sensitizer, or known additives suitable for the purposes of the composition.

DETAILED DESCRIPTION

In the present invention, acryloylmorpholine and methacyloylmorpholine are used alone or in admixture thereof as a reactive diluent for UV and EB curable resin compositions. The reactive diluent of the invention may be used in combination with other known reactive diluents, namely known photopolymerizable monofunctional monomers. It is known that the additivity applies in the PI value. When acryloylmorpholine and/or methacryloylmorpholine are used in combination with other reactive diluents, it is preferable from the safety point of view to determine the amount of other reactive diluents so that the PI value of the mixture is not more than 2. For instance, when acryloylmorpholine whose PI value is 0.50 is used in combination with nonylphenoxyethyl acrylate whose PI value is 4.3, it is preferable to use nonylphenoxyethyl acrylate in an amount of 0.36 part per part of acryloylmorpholine.

In order to compare the safety between acryloylmorpholine, methacryloylmorpholine and known reactive diluents, PI values thereof are shown in Table 1 together with the molecular weight.

TABLE 1

| Monomer | PI value | Molecular weight |
| --- | --- | --- |
| Acryloylmorpholine | 0.50 | 141 |
| Methacrylolmorpholine | <0.50 | 155 |
| Tetrahydrofurfuryl acrylate | 8.0 | 156 |
| Benzoyloxyethyl acrylate | 3.3 | 220 |
| 2-Hydroxy-3-phenoxypropyl acrylate | 3.6 | 222 |

As apparent from Table 1, the PI values of acryloylmorpholine and methacylolmorpholine is not more than 0.50 despite that the molecular weights are lower than known monofunctional monomers. It would be understood that acryloylmorpholine and methacryloylmorpholine are monofunctional monomers having a very high safety.

The PI value can be measured by applying a compound to be tested to non-treated skin and scratched skin of a normal white rabbit weighing 2.0 to 3.0 kg, according to a method as provided in 16 CFR §1500.42 (Consumer Product Safety Commission in USA). The PI value is estimated in six ranks according to the following criteria.

| PI value | Estimation |
| --- | --- |
| 0.00 to 0.03 | No irritation |
| 0.04 to 0.99 | Irritation barely perceptible |
| 1.00 to 1.99 | Slight irritation |
| 2.00 to 2.99 | Mild irritation |
| 3.00 to 5.99 | Moderate irritation |
| 6.00 to 8.00 | Severe irritation |

No problem occurs below slight irritation, but monofunctional monomers showing mild irritation must be used with special attention and the use of monofunctional monomer showing severe irritation has been avoided. Reactive diluents having a high safety, namely reactive diluents having a PI value of not more than 0.99 "irritation barely perceptible", have been demanded strongly more and more because of increasing interest in safety in recent years as well as performances of curable resin compositions and cured products. In this respect, the compound (I) is very useful as the reactive diluent.

The reactive diluent of the present invention is applicable to known prepolymers. The kinds of prepolymers are not particularly limited so long as they are soluble in the compound (I) or mixtures of the compound (I) and other known reactive diluents. Examples of the prepolymers are, for instance, a polyester acrylate, a polyurethane acrylate, an epoxy acrylate, a polyether acrylate, an alkyd acrylate, a polyol acrylate, and the like.

In the present invention, the curable resin composition may further contain a polyfunctional monomer in addition to the photopolymerizable prepolymer and the reactive diluent. The polyfunctional monomer causes a crosslinking reaction between molecular chains of the prepolymer and contributes to improvement in physical properties of cured products such as heat resistance. Known polyfunctional monomers can be used in the present invention without any restriction. Examples of the polyfunctional monomer are, for instance, diacrylates and dimethacrylates of glycols such as butylene glycol diacrylate and dimethacrylate, diethylene glycol diacrylate and dimethacrylate, hexanediol diacrylate and dimethacrylate, and neopentyl glycol diacrylate and dimethacrylate; triacrylates and trimethacrylates such as trimethylolpropane triacrylate and trimethacrylate; and the like. The polyfunctional monomer is used in an equal or less amount to the diluent, especially in an amount of one-half or less of the weight of the diluent.

The amount of the reactive diluent to the prepolymer varies depending on the kind of prepolymer and use of the composition. In general, the reactive diluent is used in an amount of 5 to 50 % by weight based on the prepolymer. It is convenient to determine a suitable amount by setting up a measure on 10 to 30 % by weight.

In case of preparing a UV curable resin composition, a photoinitiator is usually incorporated in the composition. Any of known photoinitiators can be used in the present invention. Examples of the photoinitiator are, for instance, a benzoin compound such as benzoin, benzoin methyl ether, benzoin ethyl ether, benzoin isopropyl ether, benzoin butyl ether or α-methylbenzoin, a benzil compound such as benzil or benzil methyl ketal, benzophonone, dimethoxyphenyl acetophenone, 4,4'-bis(dimethylamino)benzophenone, a sulfur compound such as thioxanthone or derivatives thereof, an azo compound such as an aryldiazonium salt, and the like.

Sensitizers may also be used in the present invention in an arbitrary amount as conventionally used in UV radiation curable compositions. Examples of the sensitizer are, for instance, an amino compound such as dimethylaminoethanol, methyl N,N-dimethylaminoanthranilate or ethyldimethylaminobenzoic acid, an acrylic monomer having tertiary amino group such as N,N-dimethylaminoethyl acrylate and methacrylate or N,N-dimethylaminopropyl acrylamide and methacrylamide, and other known sensitizers.

The UV and EB radiation curable resin compositions of the present invention may further contain a pigment, an inert organic polymer, a levelling agent, a thixotropic thickener, a thermal polymerization inhibitor, a solvent, and other additives, as occasion demands.

The UV and EB curable compositions can be prepared, applied and cured in a usual manner. Any of known light sources for radiating ultraviolet rays can be used and they are suitably selected according to objects and uses. As the light sources, there are mentioned, for instance, light sources of arc lamp type, flash lamp type, laser type and electrodeless lamp type (microwave). Also, as electron beam accelerators, both the scanning type and the curtain type can be used.

The present invention is more specifically dsecribed and explained by means of the following Examples, in which all % and parts are by weight unless otherwise noted. It is to be understood that the present invention is not limited to the Examples, and various changes and modifications may be made in the invention without departing from the spirit and scope thereof.

In the Examples, tests were made according to the following methods.

(1) Pencil Hardness

In order to examine the degree of curing of a curable resin composition, pencil hardness of a cured film was measured according to JIS K 5401 by using an electromotive pencil hardness tester (type C-221 made by Yoshimitsu Seiki Co., Ltd.) under conditions of a scratching load of 1 kg and a scratching speed of 30 mm/minute.

(2) Viscosity

The viscosity of a curable resin composition was measured by a Brookfield viscometer (unit: centipoise).

EXAMPLES 1 TO 3 AND COMPARATIVE EXAMPLES 1 TO 3

The dissolving power and reducing power of acryloylmorpholine were tested with respect to representative photopolymerizable prepolymers, namely a polyester acrylate (commercially available under the trade mark "ARONIX M-6200" made by Toagosei Chemical Industry Co., Ltd.), an epoxy acrylate (grade number C-3000 made by Somar Corporation) and a polyurethane acrylate (commercially available under the trade mark "Photomer 6008" made by San Nopco Limited). The odor of the mixture of acryloylmorpholine and the prepolymers was also estimated.

For comparison, the same texts as above were made with respect to 2-ethylhexyl acrylate conventionally used as a reactive diluent.

The results are shown in Table 2.

In Table 2, the state of the mixture of prepolymer and diluent monomer was estimated by the naked eye according to the following criteria.

| State of composition | ⊙ | : | Transparent |
|---|---|---|---|
| | O | : | Slightly cloudy |
| | X | : | Cloudy |

Also, the mixture of prepolymer and diluent monomer was smelled at a temperature between room temperature and 50° C. and estimated according to the following criteria.

| Odor | ⊙ | : | Odorless |
|---|---|---|---|
| | O | : | Slight odor |
| | X | : | Very irritating odor |

TABLE 2

| | Prepolymer (A) | Diluent monomer (B) | Mixing ratio A/B (by weight) | Viscosity (cps) | State of mixture | Odor | Viscosity measuring temperature |
|---|---|---|---|---|---|---|---|
| Ex. 1 | | | 10:0 | 2120 | ⊙ | O-⊙ | |
| | Polyester acrylate (ARONIX M-6200) | Acryloylmorpholine | 9:1 | 800 | ⊙ | O | |
| | | | 8:2 | 373 | ⊙ | O | 30° C. |
| | | | 7:3 | 146 | ⊙ | O | |
| Ex. 2 | | | 10:0 | 30450 | ⊙ | O-⊙ | |
| | Epoxy acrylate (C-3000) | Acryloylmorpholine | 9:1 | 9600 | ⊙ | O | |
| | | | 8:2 | 2900 | ⊙ | O | 50° C. |
| | | | 7:3 | 830 | ⊙ | O | |
| | | | 6:4 | 400 | ⊙ | O | |
| Ex. 3 | | | 10:0 | 25000 | ⊙ | O-⊙ | |
| | Polyurethane acrylate (Photomer 6008) | Acryloylmorpholine | 9:1 | 11900 | ⊙ | O | |
| | | | 8:2 | 4400 | ⊙ | O | 50° C. |
| | | | 7:3 | 1460 | ⊙ | O | |
| | | | 6:4 | 560 | ⊙ | O | |
| Com. Ex. 1 | Polyester acrylate (ARONIX M-6200) | 2-Ethylhexyl acrylate | 9:1 | 384 | ⊙ | X | |
| | | | 8:2 | 134 | O | X | 30° C. |
| | | | 7:3 | 77 | X | X | |
| Com. Ex. 2 | Epoxy acrylate (C-3000) | 2-Ethylhexyl acrylate | 9:1 | 4750 | ⊙ | X | |
| | | | 8:2 | 980 | ⊙ | X | 50° C. |
| | | | 7:3 | 100 | ⊙ | X | |
| | | | 6:4 | 66 | ⊙ | X | |
| Com. Ex. 3 | Polyurethane acrylate (Photomer 6008) | 2-Ethylhexyl acrylate | 9:1 | 4400 | ⊙ | X | |
| | | | 8:2 | 1760 | O | X | 50° C. |
| | | | 7:3 | 430 | O | X | |
| | | | 6:4 | 138 | O | X | |

As apparent from Table 2, acryloylmorpholine has excellent properties as a diluent such that the dissolving power and effect of decreasing viscosity are excellent irrespective of the kinds of prepolymers such as polyester acrylate, epoxy acrylate and polyurethane acrylate, and the obtained diluted solutions are in a good state and scarcely give smell.

At first view, acryloylmorpholine looks inferior in viscosity reducing effect to 2-ethylhexyl acrylate. However, it is sufficient for practical use that the viscosity of a diluted solution is below 2000–3000 cps. Therefore, as shown in Table 2, the viscosity of prepolymers can be sufficiently reduced to the desired viscosity by adding at least 10–30 % by weight of acryloylmorpholine based on the prepolymers, and there is no problem in practical use.

EXAMPLES 4 TO 6 AND COMPARATIVE EXAMPLES 4 TO 6

In order to examine the photocure activity of acryloylmorpholine as a reactive diluent for ultraviolet curable resins, ultraviolet curable compositions as shown in Table 3 were prepared by adding acryloylmorpholine or 2-ethylhexyl acrylate as a reactive diluent, a difunctional acrylic monomer, a photoinitiator and a sensitizer to each of a polyester acrylate, an epoxy acrylate and a polyurethane acrylate which were representative prepolymers.

Each of the compositions was applied in about 50 μm thick to an aluminum plate by an automatic coater (type PI-1210 made by Tester Sangyo Co., Ltd.), and ultraviolet rays were irradiated to the coated surface for a prescribed period by using a high pressure mercury lamp radiation apparatus ("Jet Printer JP-2000" made by ORC Manufacturing Co., Ltd.) (lamp: 2 kW). The pencil hardness and surface tackiness of the cured films were examined.

The results are shown in Table 4.

TABLE 3

|  | Prepolymer | Reactive diluent | UV curable composition |  |  |
|---|---|---|---|---|---|
|  |  |  | Function | Compound | Content (%) |
| Ex. 4 | Polyester acrylate | Acryloyl- morpholine | Prepolymer | ARONIX M-6200 | 60 |
|  |  |  | Difunctional acrylate | KAYARAD-HDDA*1 | 20 |
|  |  |  | Reactive diluent | Acryloylmorpholine | 15 |
|  |  |  | Photoinitiator | IRGACURE 184*2 | 3 |
|  |  |  | Sensitizer | DMAEA*3 | 2 |
| Com. Ex. 4 | Polyester acrylate | 2-Ethylhexyl acrylate | Prepolymer | ARONIX M-6200 | 60 |
|  |  |  | Difunctional acrylate | KAYARAD-HDDA | 20 |
|  |  |  | Reactive diluent | 2-Ethylhexyl acrylate | 15 |
|  |  |  | Photoinitiator | IRGACURE 184 | 3 |
|  |  |  | Sensitizer | DMAEA | 2 |
| Ex. 5 | Epoxy acrylate | Acryloyl- morpholine | Prepolymer | C-3000 | 60 |
|  |  |  | Difunctional acrylate | KAYARAD-HDDA | 20 |
|  |  |  | Reactive diluent | Acryloylmorpholine | 15 |
|  |  |  | Photoinitiator | IRGACURE 184 | 3 |
|  |  |  | Sensitizer | DMAEA | 2 |
| Com. Ex. 5 | Epoxy acrylate | 2-Ethylhexyl acrylate | Prepolymer | ARONIX M-6200 | 60 |
|  |  |  | Difunctional acrylate | KAYARAD-HDDA | 20 |
|  |  |  | Reactive diluent | 2-Ethylhexyl acrylate | 15 |
|  |  |  | Photoinitiator | IRGACURE 184 | 3 |
|  |  |  | Sensitizer | DMAEA | 2 |
| Ex. 6 | Polyure- thane acrylate | Acryloyl- morpholine | Prepolymer | Photomer 6008 | 60 |
|  |  |  | Difunctional acrylate | KAYARAD-HDDA | 20 |
|  |  |  | Reactive diluent | Acryloylmorpholine | 15 |
|  |  |  | Photoinitiator | IRGACURE 184 | 3 |
|  |  |  | Sensitizer | DMAEA | 2 |
| Com. Ex. 6 | Polyure- thane acrylate | 2-Ethylhexyl acrylate | Prepolymer | Photomer 6008 | 60 |
|  |  |  | Difunctional acrylate | KAYARAD-HDDA | 20 |
|  |  |  | Reactive diluent | 2-Ethylhexyl acrylate | 15 |
|  |  |  | Photoinitiator | IRGACURE 184 | 3 |
|  |  |  | Sensitizer | DMAEA | 2 |

(Notes)
*1KAYARAD-HDDA: Hexanediol diacrylate (product of Nippon Kayaku Co., Ltd.)
*2IRGACURE 184: Benzyl derivative photoinitiator (product of Ciba Geigy Ltd.)
*3DMAEA: N,N—dimethylaminoethyl acrylate (product of Kohjin Co., Ltd.)

TABLE 4

|  | Properties of composition |  | Properties of cured film |  |  |  |
|---|---|---|---|---|---|---|
|  | State | Odor | UV radiation time (min.) | Pencil hardness | Tackiness | Appearance |
| Ex. 4 |  |  | 1 | — | Δ | — |
|  | ⊚ | ○ | 3 | — | ○ | ○ |
|  |  |  | 5 | 4H | ⊚ | ○ |
| Com. Ex. 4 |  |  | 1 | — | X | — |
|  | ⊙ | X | 3 | — | Δ | — |
|  |  |  | 5 | F | Δ-○ | X |
| Ex. 5 |  |  | 1 | — | Δ | — |
|  | ⊙ | ○ | 3 | 3H | ○ | ⊚ |
|  |  |  | 5 | 4H | ⊚ | ⊚ |
| Com. Ex. 5 |  |  | 1 | — | X | — |
|  | ⊙ | X | 3 | — | Δ | — |
|  |  |  | 5 | 2H | Δ-○ | ⊚ |
| Ex. 6 |  |  | 1 | — | Δ | — |
|  | ⊙ | ○ | 3 | — | Δ-○ | — |
|  |  |  | 7 | 3H | ⊚ | ⊚ |
| Com. Ex. 6 |  |  | 1 | — | X | — |
|  | ○ | X | 3 | — | X-Δ | — |
|  |  |  | 7 | 2H | ○ | ○ |

In Table 4, the tackiness of the cured film was observed by touching the film with finger and estimated according to the following criteria.

| Tackiness | ⊙ | Not sticky |
|---|---|---|
| | ○ | Slightly sticky |
| | △ | Fairly sticky |
| | X | Completely wet |

Also, the surface appearance of the cured film was estimated by the naked eye according to the following criteria.

| Appearance | ⊙ | Very smooth |
|---|---|---|
| | ○ | Few blistering |
| | X | Dense blistering |

As apparent from Table 4, acryloylmorpholine has the advantages that the cure rate is very fast and it has an excellent curing activity, and also it provides cured films having a smooth surface and a high hardness, to say nothing that it has excellent abilities of dissolving prepolymers and of reducing the viscosity of prepolymers and a low PI value, namely a high safety, as stated before. It would be understood that acryloylmorpholine is very useful as a reactive diluent for UV radiation curable compositions.

In order to estimate the volatility of reactive diluent which is often called into question in practical use, the weight loss of acryloylmorpholine and conventional reactive diluents was measured at 60° C.

The results are shown in Table 5.

TABLE 5

| | Weight loss at 60° C. (%) | | | |
|---|---|---|---|---|
| Monomer | After 1 hr. | After 2 hrs. | After 3 hrs. | After 7 hrs. |
| Acryloylmorpholine | 0.2 | 0.9 | 1.4 | 2.6 |
| 2-Ethylhexyl acrylate | 3.6 | 7.1 | 10.6 | 17.2 |
| N-Vinylpyrrolidone | 2.6 | 5.2 | 8.0 | 12.8 |
| Benzyl acrylate | 15.0 | 20.0 | 28.0 | — |

From Table 5, it would be understood that the volatility of acryloylmorpholine is very low as compared with conventional reactive diluents. This fact means that acryloylmorpholine is also advantageous in quality stability of cured films and safety.

EXAMPLE 7

The same ultraviolet radiation curable composition as in Example 4 was prepared except that methacyloylmorpholine was used instead of acryloylmorpholine. The composition was completely transparent and scarcely gave an odor.

The composition was applied to an aluminium plate and cured in the same manner as in Example 4. The film cured by radiation of ultraviolet rays for 5 minutes was slightly sticky, but the film radiated for 7 minutes was completely cured and it had no stickiness and a pencil hardness of 4H and 5H.

EXAMPLES 8 AND 9 AND COMPARATIVE EXAMPLE 7

In order to examine the curing activity of acryloylmorpholine as a reactive diluent for electron beam radiation curable compositions, electron beam curable compositions were prepared by adding a difunctional acrylic monomer and a reactive diluent to a polyester acrylate or epoxy acrylate prepolymer.

Each of the compositions was applied in about 65 μm thick to an aluminum plate by an automatic coater (type PI-1210 made by Tester Sangyo Co., Ltd.), and irradiated with electron beams by an electron beam radiation apparatus ("Unitron 200/2000" made by Ushio Inc.) (applied voltage: 200 keV, exposure rate: 0.75 Mrad/pulse, dose: 0.75 to 3 Mrad). The state of cure of the cured films was examined.

The results are shown in Table 6.

TABLE 6

| | EB curable composition | | | Property of cured film | |
|---|---|---|---|---|---|
| | Function | Compound | Amount (part) | Dose (Mrad) | State of cure |
| Ex. 7 | Prepolymer | Polyester acrylate ARONIX M-600 | 60 | 0.75 | slightly sticky |
| | Difunctional monomer | KAYARAD-HDDA | 20 | 1.5 | completely cured |
| | Reactive diluent | Acryloylmorpholine | 15 | 3.0 | completely cured |
| Ex. 8 | Prepolymer | Epoxy acrylate C-3000 | 60 | 0.75 | slightly sticky |
| | Difunctional monomer | KAYARAD-HDDA | 20 | 1.5 | completely cured |
| | Reactive diluent | Acryloylmorpholine | 15 | 3.0 | completely cured |
| Com. Ex. 7 | Prepolymer | Polyester acrylate ARONIX M-600 | 60 | 0.75 | sticky |
| | Difunctional monomer | KAYARAD-HDDA | 20 | 1.5 | slightly sticky |
| | Reactive diluent | 4-Vinylpyrrolidone | 15 | 3.0 | completely cured |

As apparent from Table 6, EB radiation curable compositions containing acryloylmorpholine has a very high curing rate. It would be understood that acryloylmorpholine is excellent in curing activity and is very useful as a reactive diluent for electron beam radiation curable compositions.

In addition to the ingredients used in the Examples, other ingredients can be used in the Examples as set forth in the specification to obtain substantially the same results.

What we claim is:

1. A resin composition curable by irradiation with ultraviolet rays or electron beams, which comprises a photopolymerizable prepolymer and 5 to 50 parts by weight per 100 parts by weight of said prepolymer, of a compound of the formula wherein R is hydrogen atom or methyl group, said prepolymer being a (meth)acrylate prepolymer having a viscosity of more than 2,000 cps.

2. The composition of claim 1, wherein the compound of formula (1) is present in an amount of 10 to 30 parts by weight per 100 parts by weight of said prepolymer.

3. The composition of claim 1, which contains a photopolymerizable monofunctional vinyl monomer in an amount such that the weighted average primary skin irritation index of said compound (1) and vinyl monomer is not more than 2.

4. The composition of claim 3, wherein the total amount of the compound (1) and vinyl monomer is from 5 to 50 % by weight based on said prepolymer.

5. The composition of claim 1, which contains a photopolymerizable polyfunctional monomer.

6. The composition of claim 1, which contains a photoinitiator in an amount sufficient to initiate the polymerization.

7. The composition of claim 6, wherein said photoinitiator is used in combination with a sensitizer.

8. The composition of claim 1, которая имеет viscosity below 3,000 cps.

* * * * *